United States Patent [19]

Sayles

[11] Patent Number: 5,002,797

[45] Date of Patent: Mar. 26, 1991

[54] PROCESS FOR ALUMINUM-ENCAPSULATED AMMONIUM PERCHLORATE BY VAPOR DEPOSITION

[75] Inventor: David C. Sayles, Huntsville, Ala.

[73] Assignee: The United States of America as represented by the Secretary of the Army, Washington, D.C.

[21] Appl. No.: 335,911

[22] Filed: Apr. 10, 1989

[51] Int. Cl.$^5$ .................. C23C 14/18; C23C 14/26
[52] U.S. Cl. ........................... 427/49; 427/217;
427/251; 427/255.5; 118/716; 149/5; 149/76;
44/500; 44/501; 428/403
[58] Field of Search ............. 427/49, 217, 251, 255.5,
427/294; 118/716, 50.1, 620, 726, 727; 428/403;
44/500, 501, 542, 603, 641; 149/5, 76

[56] References Cited

U.S. PATENT DOCUMENTS 3,953,256  4/1976  Schwarz et al. .................. 149/5
4,353,938  12/1982  Sterling et al. ................... 427/214

Primary Examiner—John F. Niebling
Assistant Examiner—David G. Ryser
Attorney, Agent, or Firm—Freddie M. Bush; James T. Deaton

[57] ABSTRACT

Aluminum-coated ammonium perchlorate is prepared in an apparatus consisting of a four-opening reaction flask (which serves as a vacuum chamber). The reaction flask is fitted with an electrically-heated tungsten helix coil (for vaporizing the aluminum), a mercury diffusion pump, a mechanical vacuum pump, a dry ice-acetone-cooled trap, and a McLeod pressure-measurement gage. The heater electrodes are submitted through two of the openings; reduced pressure operation is maintained through the third opening, and the aluminum is fed through the fourth opening. The reaction flask is operated at approximately 10 Torr. A magnetic stirrer permits the ammonium perchlorate to be vaporized onto the surface of the ammonium perchlorate after the melted aluminum on the tungsten helix coil is subsequently vaporized from the tungsten helix coil. The aluminum-coated ammonium perchlorate is tested in a solid composite propellant composition wherein it increases the propellant's burning rate, extends the storage life of interceptor motor containing the solid composite propellant composition, and improves the solid composite propellant composition mechanical properties. The percentage coating varies from about one percent to about four percent depending on particle size of ammonium perchlorate. Although, only approximately 10% of the ammonium perchlorate particles are coated, the burning rate increase, the benefits to shelf life, and improved mechanical properties are significant.

4 Claims, 1 Drawing Sheet

PROCESS FOR ALUMINUM-ENCAPSULATED AMMONIUM PERCHLORATE BY VAPOR DEPOSITION

DEDICATORY CLAUSE

The invention described herein may be manufactured, used, and licensed by or for the Government for governmental purposes without the payment to me of any royalties thereon.

BACKGROUND OF THE INVENTION

Composite propellant compositions require good mechanical properties, good stability during storage, and controlled burning rates as required for their performance parameters. Since a high percentage of a composite propellant composition of interceptor motors is comprised of ammonium perchlorate oxidizer and a fuel component which is generally aluminum metal bound within rubbery binders, the opportunity of chemical interactions which may occur between the oxidizing functional groups and the fuel component is always present. The presence of other reactive materials contribute further to other chemical interactions. These interactions are desirable during the combustion process; however, the interactions during storage could cause undesirable stability problems.

Thus, a desirable combination would be a change which increases the propellant's burning rate, extends the storage life of interceptor motors, and improves the propellant mechanical properties. The opportunity of acceptance of a triple benefit such as noted is seldom available; however, as further disclosed hereinbelow a triple benefit is derived from the disclosed invention.

From the observation of high-speed photographs of burning solid propellants it has been determined that the combustion of aluminum metal powder occurs at a considerable distance from the propellant's surface. If this combustion or rapid oxidation process were to occur at the propellant's surface, considerably more heat would be transmitted back into the propellant, and a major enhancement of the burning rate would take place. This achievement would result in a reduced need for burning rate enhancers or the complete elimination of their need in the propellant composition.

An object of this invention is to provide aluminum-encapsulated ammonium perchlorate to effect an increase in the burning rate of the propellant composition containing the encapsulated ammonium perchlorate.

A further object of this invention is to provide aluminum-encapsulated ammonium perchlorate to effect an increase in the storage life of interceptor motors containing the encapsulated ammonium perchlorate.

Still a further object of this invention is to provide aluminum-encapsulated ammonium perchlorate to effect an improvement in the propellant mechanical properties containing the encapsulated ammonium perchlorate.

SUMMARY OF THE INVENTION

Ammonium perchlorate is vapor deposited with aluminum metal to achieve increased burning rate of propellant extended storage life of propellant, and improve mechanical properties of propellant.

Aluminum metal is vapor deposited onto ammonium perchlorate after first being melted onto an electrically heated tungsten helix. The reaction system which is further described below is operated at approximately 10 Torr.

The apparatus used in the manufacture of the aluminum-encapsulated ammonium perchlorate of this invention for the reduced pressure deposition of aluminum onto ammonium perchlorate consists of a one-liter, four-opening reaction flask (which also functions as the vacuum chamber). The flask is fitted with an electrically-heated tungsten helix (for vaporizing the aluminum), a mercury diffusion pump, a mechanical vacuum pump, a dry ice-acetone-cooled trap and a McLeod pressure-measurement gage. The heater electrodes are inserted through two of the openings; reduced pressure operation is maintained through a third opening, and the aluminum is fed through a fourth opening. This reaction system is operated at approximately 10 Torr.

Ammonium perchlorate having a predetermined particle size is placed into the reactor flask which is then equipped with a glass-encased magnetic stirrer. Aluminum wire (0.03 inch in diameter), or otherwise finely divided, is melted onto a tungsten coil heating element to a red heat by applying a DC voltage from a DC power source. After the small quantity of aluminum is melted, the tungsten coil is heated to evaporate the melted aluminum which is allowed to condense on the ammonium perchlorate. The steps are repeated until the ammonium perchlorate is partially coated or encapsulated. The amount of aluminum wire consumed is based on a coating percentage from about one to about 4 weight percent.

DESCRIPTION OF THE PREFERRED EMBODIMENT

Aluminum vapor deposited onto ammonium perchlorate is prepared by first melting finely divided aluminum onto a electrically heated coil made of tungsten and then increasing the temperature of the tungsten coil to vaporize the aluminum onto the ammonium perchlorate.

Figure 1:
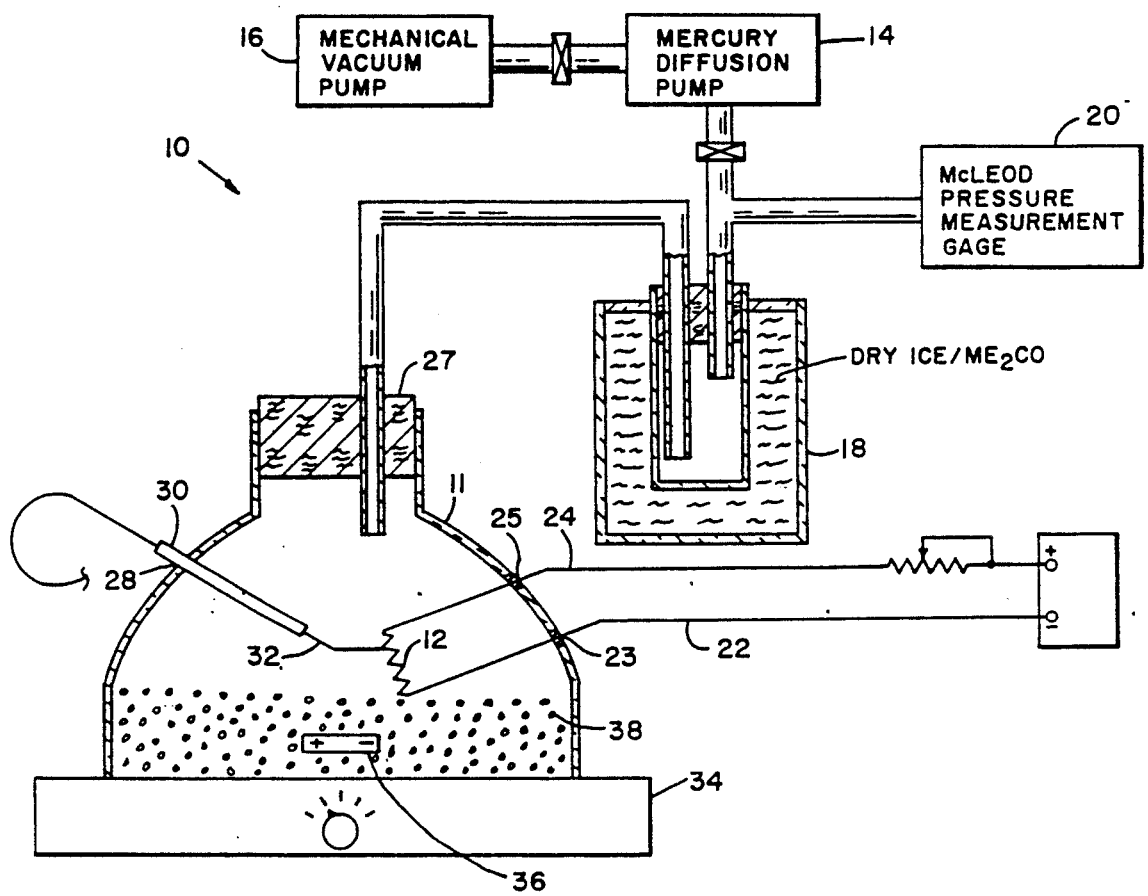
FIG. 1 is an aluminum vapor deposition apparatus for encapsulating ammonium perchlorate.
Figure 2:
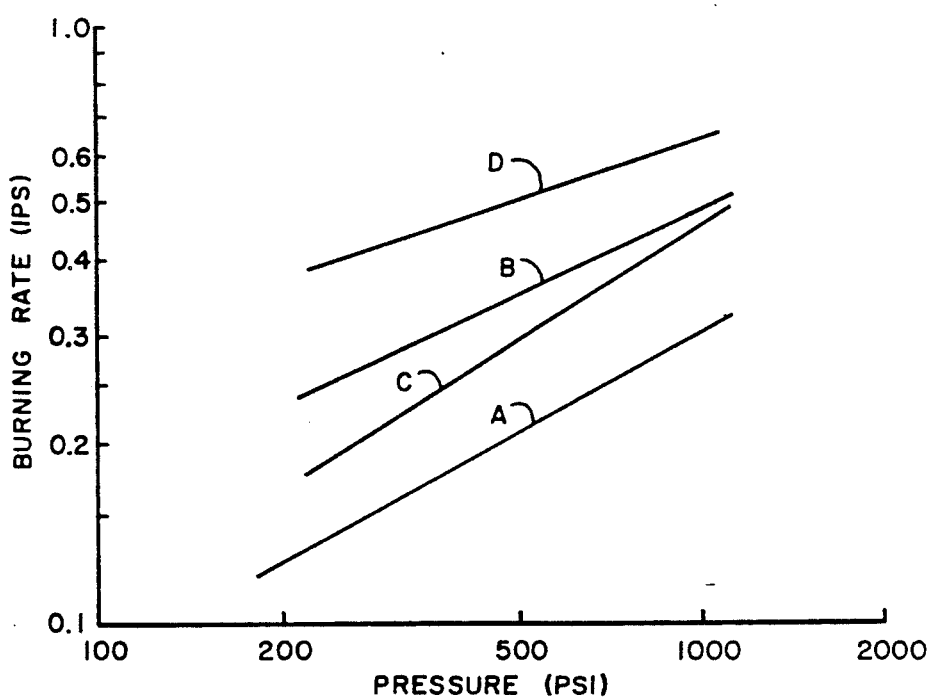
FIG. 2 depicts a comparison of propellant burning rates with and without aluminum-coated ammonium perchlorate.

In further reference to the Figures of the Drawing, an aluminum vapor deposition apparatus for encapsulating ammonium perchlorate is depicted as 10 in FIG. 1, and a comparison of the burning rates of propellant with and without aluminum-coated ammonium perchlorate is shown in FIG. 2. Curve A of FIG. 2 depicts burning rate of propellant using 200 micrometer ammonium perchlorate whereas curve B of FIG. 2 depicts burning rate of aluminum-coated ammonium perchlorate for 200 micrometer particle size. Curves C and D of FIG. 2 depict burning rates for 50 micrometer ammonium perchlorate of the uncoated and aluminum-coated ammonium perchlorate respectively.

The apparatus used in the manufacture of the aluminum-encapsulated ammonium perchlorate of this invention for the reduced pressure deposition of aluminum onto ammonium perchlorate consists of a one-liter, four-opening reaction flask (which serves as the vacuum chamber) is shown as 10 of FIG. 1. The flask is fitted with an electrically-heated tungsten helix 12 (for vaporizing the aluminum), a mercury diffusion pump 14, a mechanical vacuum pump 16, a dry ice-acetonecooled trap 18, and a McLeod pressure-measurement gage 20. The heater electrodes 22 and 24 are inserted through two of the openings 23 and 25; reduced pressure operation is maintained through the third opening 27; and the aluminum is fed through the fourth opening 28. This reaction system is operated at approximately 10 Torr. A lower vacuum can be achieved by using a number of diffusion pumps or stages in series.

An aluminum feed rod 30 of FIG. 1 is employed to feed fine aluminum wire 32 onto the electrically-heated tungsten helix 12. A magnetic stirrer fixture 34 including a glass-encased, magnetic stirrer bar 36 is provided to achieve the mixing of the ammonium perchlorate 38 during vapor deposition process.

The processing steps of encapsulating aluminum comprise 1. placing ammonium perchlorate (10g) to be encapsulated in a reaction flask equipped with a glass-encased, magnetic stirring rod;

2. affixing aluminum wire (0.03 inch diameter) to a feed rod for feeding aluminum wire into reaction flask;

3. attaching a tungsten wire heating coil between two electrodes and suspending the wire heating coil in the reaction flask;

4. heating the tungsten coil to a red heat with an applied DC voltage from a DC power supply;

5. melting a small quantity of aluminum onto the tungsten coil by advancing the aluminum wire by the feed rod;

6. increasing the temperature of the tungsten coil to evaporate the melted aluminum from the tungsten coil;

7. allowing the evaporated aluminum to deposit onto the ammonium perchlorate while mixing or tumbling the ammonium perchlorate with a magnetic stirrer; and, 8. repeating the steps of advancing, melting, and evaporating the aluminum wire until all of the aluminum wire is consumed.

Procedure for Determining Aluminum Coating on Ammonium Perchlorate

Determination of the quantity of aluminum which was deposited on the ammonium perchlorate particles is carried out gravimetrically. The procedure consists of dissolving out the ammonium perchlorate with water at room temperature from a previously-weighed specimen of the aluminum-coated ammonium perchlorate. The mixture is then filtered through a tared Gooch crucible using a filtering aid, such as SuperCel. The filter cake is washed with a small quantity of propanone to accelerate drying. The filter cake is dried at 105°–110° C.; allowed to cool and weighed. The percentage of aluminum coating on the particles of ammonium perchlorate is thus determined, and the data are presented in Table 1.

TABLE 1

Percentage of Aluminum-coating on Aluminum-coated Ammonium Perchlorate

| Ammonium perchlorate (Weight-Mean-Diameter) | Percentage of Aluminum Coating |
|---|---|
| 200 micrometers | 1% |
| 50 micrometers | 1% |
| 5 micrometers | 4% |

X-ray analysis of the aluminum-coated ammonium perchlorate is carried out to determine whether the high temperature conditions which are used to bring about the volatilization of the aluminum caused any vaporizing of tungsten from the heating coils. Had this occurred, it would have invalidated the determination of the amount of aluminum deposited on the ammonium perchlorate. The X-ray analysis revealed the existence of only titanium, sodium and potassium in trace amounts, and no tungsten.

Photomicrographs of the aluminum-coated ammonium perchlorate showed that approximately 10% of the ammonium perchlorate particles is coated with aluminum.

Based on the above evaluation and by testing the aluminum-coated ammonium perchlorate in a propellant composition, it is confirmed that an effective burning rate increase is achieved when the aluminum is vapor condensed only upon a relatively small percentage of the surface of the ammonium perchlorate particles.

A comparison of the effectiveness of aluminum-coated ammonium perchlorate as a burning rate accelerator in solid propellants with a propellant composition which contained the usual aluminum powder and ammonium perchlorate is carried out in propellant formulations. These data are presented in Table II below, and in FIG. 2 of the drawing.

TABLE II

Comparison of Propellants With & Without Aluminum-Coated Ammonium Perchlorate

| Composition Ingredients | | | |
|---|---|---|---|
| Hydroxyl-terminated polybutadiene prepolymer | (%) | 13.7 | 13.7 |
| Methylene-2,2-bis(4-methyl-6-t-butylphenol) | | | |
| Isophorone diisocyanate* | | | |
| Isophthaloyl bis[1-(2-methylaziridine)] | (%) | 0.3 | 0.3 |
| Aluminum powder | (%) | 16.0 | 15.0 |
| Ammonium perchlorate (5-micrometers) | (%) | 22.0 | — |
| Ammonium perchlorate (50-micrometers) | (%) | 48.0 | 48. |
| Aluminum-coated** ammonium perchlorate (5-micrometers) | (%) | — | 23.0 |
| Mechanical Properties | | | |
| Stress (77° F.) (psi) | (%) | 250 | 260 |
| Strain @ Max. Stress | | 27 | 28 |
| Modulus (psi) | | 1800 | 2050 |
| Ballistic Properties | | | |
| Burning rate (2000 psi) (ips) | | 0.69 | 0.95 |
| Impact (kg-cm) | | 50 | 50 |
| Friction (lbs) | | 55 | 80 |
| Spark (Joules) | | 25 | 25 |
| Processing Properties | | | |
| End-of-mix viscosity (Kp) | | 32 | 33 |
| Required cure time (140° F.-Days) | | 2 | 3 |
| Potlife (Hours) | | 2 | 3 |

*Hydroxyl-to-isocyanate ratio = 1/0.75
**1% coating

A review of the data presented in Table I points up the differences in the effect that aluminum-coated ammonium perchlorate has in a propellant composition. The most obvious, and the most significant, difference between the aluminum-coating ammonium perchlorate and uncoated ammonium perchlorate is the increase in burning rate obtained with the aluminum-coated ammonium perchlorate. Another significant difference is in friction sensitivity. Aluminum coating the smaller ammonium perchlorate particles in a bimodal distribution of ammonium perchlorate provides a means of reducing the sensitivity of propellants.

Thus, aluminum-encapsulated ammonium perchlorate achieves the beneficial effects listed below under (a)–(c), for the composite propellant composition.

Following these beneficial effects are added comments which provide possible bases for achieving the results and other related benefits to be derived from using aluminum-encapsulated ammonium perchlorate.

(a) Increasing the propellant's burning rate

From the observation of high-speed photographs of burning solid propellants it has been determined that the combustion of the aluminum powder occurs at a considerable distance from the propellant's surface. When this oxidation process occurs at the propellant's surface, considerably more heat is transmitted back into the propellant, and a major enhancement of the burning rate takes place. This results in a reduced need for burning rate enhancers or the complete elimination of their need.

(b) Extending the storage life of interceptor motors

The shelf life of interceptor motors is determined by the chemical interactions which occur between the oxidizing functional groups and the fuel components in the solid propellants. By interposing aluminum which is partially coated onto the ammonium perchlorate particles, this will reduce the interactions among the ammonium perchlorate and the other constituents in the propellant, especially during the aging process. As a consequence, not only will the propulsion subsystem's performance undergo less change during the normal storage period but it will result in prolonging the useful storage life.

(c) Improving the propellant mechanical properties

The improvement in mechanical properties derives from the fact that the composite materials formed from the rubbery binders with a metallic filler are superior to propellants that are formed with an ionic substrate.

Increasing the burning rate in this manner could result in the elimination of the need for incorporating a ferrocenyl compound (such as Catocene) or iron oxide, etc. This would result in the elimination of undesirable chemical side reactions that occur because of the incorporation of such ingredients in the propellant.

I claim:

1. A method for vapor depositing of aluminum onto ammonium perchlorate particles which comprises completing the steps of:

(i) placing a predetermined quantity of ammonium perchlorate particles of a predetermined size in a four-opening reaction flask adapted for operation under reduced pressure, and provided with a magnetic stirrer, said reaction flask having two openings serving as ports for inserting a pair of electrodes for an electrically-heated tungsten helix for melting and vaporizing aluminum, another opening serving as a port for an aluminum feed rod for feeding very fine diameter aluminum wire to the tungsten helix, and another opening serving as a port for reduced pressure operation at approximately 10 Torr for said reaction flask;

(ii) affixing a predetermined amount of aluminum wire of a very fine diameter to an aluminum feed rod for feeding said aluminum wire into said reaction flask after said aluminum feed rod is inserted into said opening for said aluminum feed rod of said reaction flask;

(iii) inserting said electrodes that are electrically connected to a variable DC power source into said reaction flask;

(iv) attaching a tungsten helix between said electrodes within said reaction flask;

(v) heating said tungsten helix to a red heat with applied DC voltage from said variable DC power source;

(vi) melting a small quantity of said very fine diameter aluminum wire onto said tungsten helix after said very fine aluminum wire is advanced onto said tungsten helix by said aluminum feed rod;

(vii) increasing the temperature of said tungsten helix to evaporate said small quantity of said very fine diameter aluminum wire that is melted onto said tungsten helix, (viii) allowing said small quantity of said very fine aluminum wire, melted onto and evaporated from said tungsten helix, to deposit onto said ammonium perchlorate particles while mixing or tumbling said ammonium perchlorate with a magnetic stirrer; and, (ix) repeating the steps of advancing, melting, and evaporating said aluminum wire until all of predetermined quantity of aluminum wire is consumed to form aluminum-coated ammonium perchlorate.

2. The method for vapor depositing of aluminum on ammonium perchlorate particles as defined in claim 1 wherein said predetermined quantity of said ammonium perchlorate particles is about 10 grams, said predetermined particle size of said ammonium perchlorate has a weight-mean-diameter of about 200 micrometers, and wherein said predetermined quantity of aluminum wire having a predetermined diameter of about 0.03 inch diameter is consumed and coated onto said ammonium perchlorate particles to yield about a one weight percentage coating on said ammonium perchlorate particles.

3. The method for vapor depositing of aluminum on ammonium perchlorate particles as defined in claim 1 wherein said predetermined quantity of said ammonium perchlorate particles is about 10 grams, said predetermined particle size of said ammonium perchlorate has a weight-mean-diameter of about 50 micrometers, and wherein said predetermined quantity of aluminum wire having a predetermined diameter of about 0.03 inch diameter is consumed and coated onto said ammonium perchlorate particles to yield about a one weight percentage coating on said ammonium perchlorate particles.

4. The method for vapor depositing of aluminum on ammonium perchlorate particles as defined in claim 1 wherein said predetermined quantity of said ammonium perchlorate particles is about 10 grams, said predetermined particle size of said ammonium perchlorate has a weight-mean-diameter of about 5 micrometers, and wherein said predetermined quantity of aluminum wire having a predetermined diameter of about 0.03 inch diameter is consumed and coated onto said ammonium perchlorate particles to yield about a four weight percentage coating on said ammonium perchlorate particles.

* * * * *